United States Patent
Nölscher et al.

(10) Patent No.: US 8,003,538 B2
(45) Date of Patent: Aug. 23, 2011

(54) METHOD FOR PRODUCING A STRUCTURE ON THE SURFACE OF A SUBSTRATE

(75) Inventors: Christoph Nölscher, Nürnberg (DE);
Dietmar Temmler, Dresden (DE); Peter Moll, Dresden (DE)

(73) Assignee: Qimonda AG, Munich (DE)

( * ) Notice: Subject to any disclaimer, the term of this patent is extended or adjusted under 35 U.S.C. 154(b) by 616 days.

(21) Appl. No.: 12/114,948

(22) Filed: May 5, 2008

(65) Prior Publication Data
US 2008/0206681 A1    Aug. 28, 2008

Related U.S. Application Data

(63) Continuation of application No. 11/182,066, filed on Jul. 15, 2005, now Pat. No. 7,368,385.

(30) Foreign Application Priority Data

Jul. 17, 2004    (DE) .......................... 10 2004 034 572

(51) Int. Cl.
*H01L 21/302* (2006.01)

(52) U.S. Cl. ........ 438/692; 438/673; 438/689; 438/595; 438/696; 257/622; 257/797; 257/798

(58) Field of Classification Search .................. 438/673, 438/689, 595, 692, 696, 697; 257/622, 797, 257/798
See application file for complete search history.

(56) References Cited

U.S. PATENT DOCUMENTS

| | | | |
|---|---|---|---|
| 5,536,606 A * | 7/1996 | Doan | 430/5 |
| 5,668,018 A | 9/1997 | Cronin et al. | |
| 6,037,629 A * | 3/2000 | Gardner et al. | 257/333 |

(Continued)

FOREIGN PATENT DOCUMENTS

DE    4235702    4/1994

(Continued)

OTHER PUBLICATIONS

Eugen Philippow, Taschenbuch Elektrotechink, vol. 2, Grundlagen der informationstechnik, 3rd strongly revised edition, VEB Verlag Technik, Berlin, 1987, pp. 492-496, translation provided for Figure 8. 133 and corresponding text cited by the German Patent Office in the Protocol of the Oral Proceedings dated Jul. 3, 2007. German Office Action dated Feb. 4, 2005, directed to counterpart German application.

*Primary Examiner* — Nadine G Norton
*Assistant Examiner* — Maki A Angadi
(74) *Attorney, Agent, or Firm* — Patterson & Sheridan, LLP

(57) ABSTRACT

The present invention relates to a method for producing a structure serving as an etching mask on the surface of a substrate. In this case, a first method involves forming a first partial structure on the surface of the substrate, which has structure elements that are arranged regularly and are spaced apart essentially identically. A second method involves forming spacers on the surface of the substrate, which adjoin sidewalls of the structure elements of the first partial structure, cutouts being provided between the spacers. A third method step involves introducing filling material into the cutouts between the spacers, a surface of the spacers being uncovered. A fourth method step involves removing the spacers in order to form a second partial structure having the filling material and having structure elements that are arranged regularly and are spaced apart essentially identically. The structure to be produced is composed of the first partial structure and the second partial structure.

22 Claims, 6 Drawing Sheets

U.S. PATENT DOCUMENTS

| | | |
|---|---|---|
| 6,645,851 B1 | 11/2003 | Ho et al. |
| 6,645,857 B1 | 11/2003 | Whitefield et al. |
| 7,368,385 B2 | 5/2008 | Nölscher et al. |
| 2002/0043690 A1 | 4/2002 | Doyle et al. |
| 2003/0073298 A1 | 4/2003 | Gonzalez |

FOREIGN PATENT DOCUMENTS

| | | |
|---|---|---|
| DE | 4236609 | 5/1994 |
| EP | 0036111 | 9/1981 |
| EP | 0313250 | 10/1988 |

\* cited by examiner

METHOD FOR PRODUCING A STRUCTURE ON THE SURFACE OF A SUBSTRATE

CROSS-REFERENCE TO RELATED APPLICATIONS

This application is a continuation of U.S. patent application Ser. No. 11/182,066, filed Jul. 15, 2005, now U.S. Pat. No. 7,368,385 which claims priority to German Application No. 10 2004 034 572.4-51, filed Jul. 17, 2004. Each of the aforementioned related patent applications is herein incorporated by reference in its entirety.

TECHNICAL FIELD OF THE INVENTION

The present invention relates to a method for producing a structure serving as an etching mask on the surface of a substrate.

BACKGROUND OF THE INVENTION

Particular patterning methods are used for producing extremely fine structures in the surface of a substrate such as, for example, microelectronic circuit structures or gratings for surface acoustic wave filters or semiconductor lasers. One of the most familiar methods known since the beginnings of semiconductor technology is optical microlithography. In this case, a radiation-sensitive photoresist layer is applied to the surface of a substrate that is to be patterned, and is exposed with the aid of electromagnetic radiation through an exposure mask. During the exposure operation, lithographic structures arranged on the exposure mask are imaged onto the photoresist layer with the aid of a lens system and transferred into the photoresist layer by means of a subsequent development process. The photoresist structures produced in this way are subsequently used as an etching mask during the formation of the structures in the surface of the substrate in one or more etching processes.

A principal objective of the semiconductor industry is continuous miniaturization of the structures, i.e. continuous reduction of the structure dimensions and of the distance between individual structure elements. In this case, the resolution limit that can be achieved for the structures is primarily limited by the wavelength of the radiation used. Therefore, ever shorter exposure wavelengths are also used in the course of the structure miniaturization sought. At the present time, the shortest exposure wavelengths used are 248 and 193 nm.

In order to increase the resolution limit in present-day optical lithography methods, special exposure masks such as alternating phase masks or binary masks with dipole illumination are used. In this way, a minimum center-to-center distance between the structure elements of 110 nm can be achieved by way of example in the case of a lithography process with an exposure wavelength of 193 nm.

In order to increase the resolution limit further, lithography methods which work with even shorter exposure wavelengths are being developed. These include lithography with an exposure wavelength of 157 nm and so-called EUV lithography with extreme ultraviolet light (EUV), in which the exposure wavelength is around 13 nm. A further lithography technique that is in development is so-called immersion lithography. In this case, the space between the lens system and the substrate to be patterned is filled with a liquid in order to improve the resolution capability. However, all these techniques will only be available in the future.

In order to produce very small structures, it is possible, furthermore, to use so-called electron beam lithography, in which a finely focused electron beam is directed over a photoresist layer that is sensitive to an electron beam. However, since each structure element has to be written individually in the case of this method, the method proves to be very time-intensive. Moreover, the method is relatively expensive on account of the low throughput resulting from this.

DE 42 35 702 A1 discloses a further method for producing very fine structures, in particular line or grating structures, in the surface of a substrate. This method is based on subdividing the structure to be produced into two partial structures, which are first of all formed as photoresist structures on the substrate surface in mutually separate lithography processes. The two photoresist structures are subsequently used as etching masks for producing the entire structure in the substrate surface in an etching process. Since adjacent structure elements of the structure produced in this way lie on a (center-to-center) distance grid that is half as large as that of structure elements in the individual partial structures, very fine structures can be produced by means of this method. In particular, it is possible to realize a distance between the structure elements which lies below the resolution limit of the underlying lithography processes. However, possible overlay errors of the two separate lithography processes prove to be a major disadvantage, as a result of which the imaging accuracy of the method is restricted.

A further method for producing very fine structures, in particular line structures, is disclosed in DE 42 36 609 A1. In this method, first of all an initial structure is produced on the surface of a substrate with the aid of a lithography process. Spacers are subsequently produced on the substrate surface, which laterally delimit the structure elements of the initial structure. After the removal of the initial structure, the spacers are used as an etching mask for producing a structure in the surface of the substrate. This method also makes it possible to realize minimum distances between structure elements of a structure below the resolution capability of the lithography process used for producing the initial structure. However, a major disadvantage of the method is that structure size fluctuations in the case of the initial structure bring about positional fluctuations of the spacers and thus of the structure elements of the structure to be produced. Consequently, the production of a regular structure in which all structure elements lie as far as possible exactly on a predetermined center-to-center distance grid is possible only to a limited extent.

SUMMARY OF THE INVENTION

The present invention provides an improved method for producing a very fine structure serving as an etching mask on the surface of a substrate.

The invention proposes a method for producing a structure serving as an etching mask on the surface of a substrate. In this case, a first method step involves forming a first partial structure on the surface of the substrate, which has structure elements that are arranged regularly and are spaced apart essentially identically. A second method involves forming spacers on the surface of the substrate, which adjoin sidewalls of the structure elements of the first partial structure, cutouts being provided between the spacers. A third method involves introducing filling material into the cutouts between the spacers, a surface of the spacers being uncovered. A fourth method involves removing the spacers in order to form a second partial structure having the filling material and having structure elements that are arranged regularly and are spaced apart essentially identically. The structure to be produced is composed of the first partial structure and the second partial structure.

The method according to the invention affords a possibility for forming a very fine structure serving as an etching mask, in particular a line or grating structure, on the surface of a substrate with a high accuracy. Since the cutouts between the spacers are utilized for producing the structure elements of the second partial structure, which essentially lie in each case in the center between adjacent structure elements of the first partial structure, the structure elements of the second partial structure are also arranged essentially in self-aligned fashion in the center between adjacent structure elements of the first partial structure. Consequently, the structure elements of the structure composed of the first and second partial structures lie as far as possible exactly on a predetermined center-to-center distance grid. Adjacent structure elements of the structure in this case have a center-to-center distance that is half as large in comparison with individual partial structures.

In the embodiment, the second method involves applying a spacer layer in large-area fashion on the surface of the substrate, which covers the structure elements of the first partial layer in order to form the spacers. In this case, the thickness of the spacer layer and also the width of the structure elements of the first partial structure prescribe the width of the cutouts between the spacers and thus the width of the structure elements of the second partial structure.

In a further preferred embodiment, a part of the spacer layer is eroded or removed after application in such a way that surfaces of the structure elements of the first partial structure are uncovered.

In accordance with a further preferred embodiment, the third method involves applying the filling material in large-area fashion on the spacer layer or on the surfaces of the structure elements of the first partial structure and subsequently removing or eroding the filling material in such a way that the filling material remains within the cut-outs provided between the spacers.

Since the edges of the spacer layer or of the spacers in the upper region of the cutouts may be formed in rounded fashion, it is preferred in particular for the filling material to be removed or eroded as far as a depth of the cutouts at which sidewalls of the spacers have a maximum inclination in a range of $-10°$ to $+10°$ with respect to a vertical. This ensures that the sidewalls of the structure elements of the second partial structure have a correspondingly small inclination, as a result of which a particularly good etching result can be achieved with the structure that is composed of the first and second partial structures and serves as an etching mask.

In accordance with a further preferred embodiment, the filling material is a photoresist which is applied as a photoresist layer in large-area fashion on the surface of the substrate and is exposed and developed for the purpose of removal. If the spacer layer or the spacers comprise a light-absorbing material, the photoresist layer can also be exposed and developed in large-area fashion. On account of absorption and/or defraction of the exposure radiation, the photoresist situated within the cutouts experiences no exposure starting from a certain depth. Consequently, during the subsequent development operation, the photoresist is removed outside the cutouts and in an upper region within the cutouts, while the cutouts remain filled with the photoresist in a lower region.

In a further preferred embodiment, the photoresist layer serving as filling material is exposed and developed in patterned fashion. In this way, it is possible to produce further structure elements on the substrate surface which, by way of example, connect the structure elements of the first and second partial structures to one another.

In this connection, it is preferred, in particular, for the first partial structure on the surface of the substrate additionally to have a large-area structure element in a manner adjoining the structure elements that are arranged regularly. In this case, the patterned photoresist layer is used as an etching mask for patterning the large-area structure element of the first partial structure before the spacers are removed. In this way, it is possible to supplement the structure to be produced by further structure elements adjoining the regularly arranged structure elements of the first partial structure.

BRIEF DESCRIPTION OF THE DRAWINGS

The invention is explained in more detail below with reference to exemplary embodiments in the figures, in which:

FIGS. 1a to 7a show the production of a structure on the surface of a substrate in accordance with a first embodiment of a method according to the invention in plan view.

FIGS. 1b to 7b show the lateral sectional illustrations of the production of the structure which correspond to FIGS. 1a to 7a.

DETAILED DESCRIPTION OF THE INVENTION

Figure 1A:
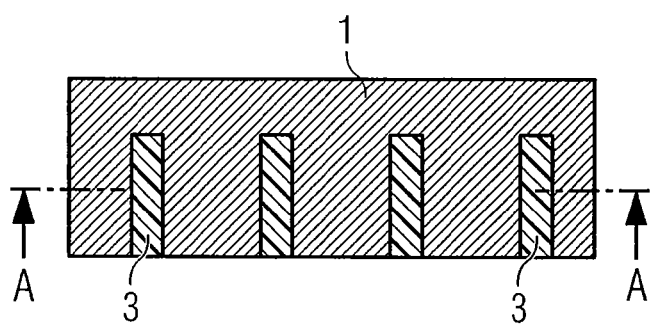

FIGS. 1a to 7a show the production of a structure serving as an etching mask on the surface of a substrate 10 in accordance with a first embodiment of a method according to the invention in plan view. Lateral sectional illustrations corresponding to FIGS. 1a to 7a along the section line AA of FIG. 1a are shown in FIGS. 1b to 7b. In this method, a first partial structure 11 is formed on the substrate surface 10 with the aid of a customary lithography process, the partial structure having lines 12 arranged on a regular center-to-center distance grid.

Figure 1B:
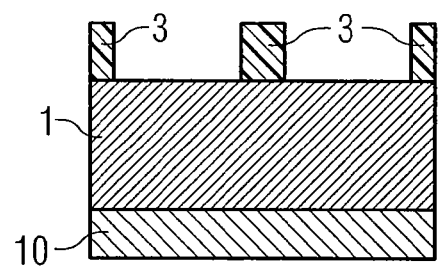
Figure 2A:
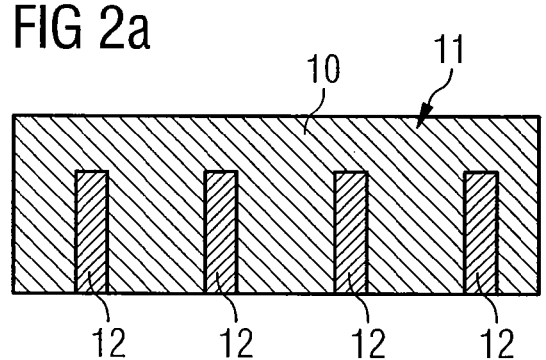
Figure 2B:
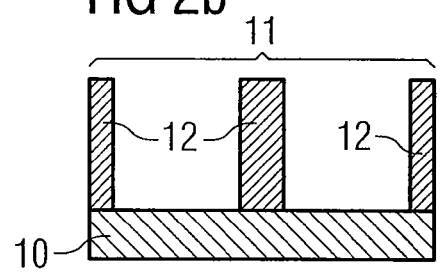

For this purpose, a layer 1 is applied to the substrate surface 10 and a photoresist layer 3 is subsequently deposited onto the layer 1. Afterward, the photoresist layer 3 is patterned by means of corresponding exposure and development processes, the patterned photoresist layer 3, as illustrated in FIGS. 1a and 1b, having a regular pattern of lines that are spaced apart essentially identically. The substrate 10 is for example a silicon substrate wafer coated with a silicon oxynitride layer. The layer 1 comprises polysilicon or tungsten, by way of example.

The patterned photoresist layer 3 is subsequently used as an etching mask for etching the layer 1. After the etching operation and a subsequent removal of the photoresist layer 3, there remains on the substrate surface 10 the first partial structure 11—illustrated in FIGS. 2a and 2b—with freestanding lines 12 arranged on a regular center-to-center distance grid. In this case, the lines 12 preferably have a minimum distance.

In order to obtain the smallest possible line widths of the lines 12, further process steps may optionally be carried out. One possible procedure includes, for example, in overexposure and/or overdevelopment of the photoresist layer 3, as a result of which the lines 12 have sharper contours. Furthermore, the lines 12 produced may also be laterally overetched in order to obtain smaller line widths. The thickness of a line 12 preferably corresponds to triple the line width. By way of example, a line 12 has a thickness of 150 nm and a width of 50 nm.

Figure 3A:
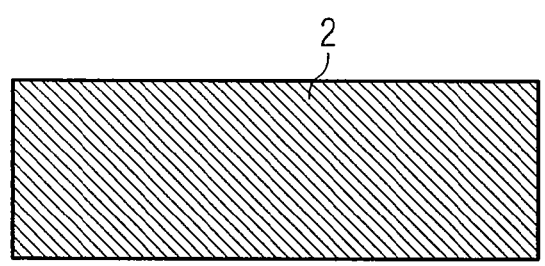
Figure 3B:
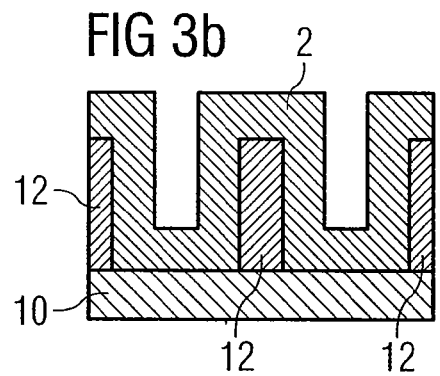

Afterward, as illustrated in FIGS. 3a and 3b, a spacer layer 2 covering the lines 12 is applied in large-area fashion on the substrate surface 10. The spacer layer 2 comprises silicon dioxide or silicon nitride, by way of example, and preferably has a layer thickness corresponding to the width of the lines 12.

Figure 4A:
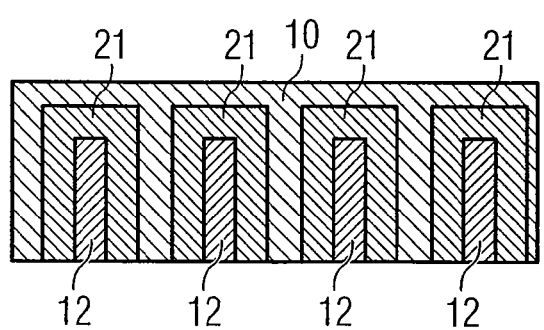
Figure 4B:
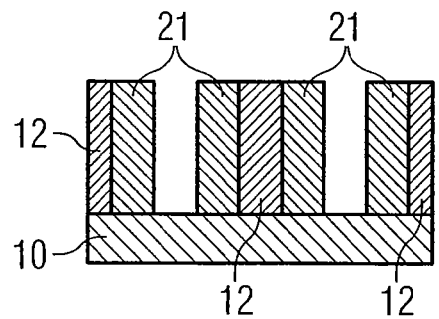

After application, the spacer layer 2 is subjected to an anisotropic etching, so that the surfaces of the lines 12 are uncovered, as illustrated in FIGS. 4a and 4b. The lines 12 here are in each case enclosed by spacers 21 which adjoin sidewalls of the lines 12. Cutouts are provided between adjacent spacers 21, as already in the case of the spacer layer 2 prior to the anisotropic etching.

Figure 5A:
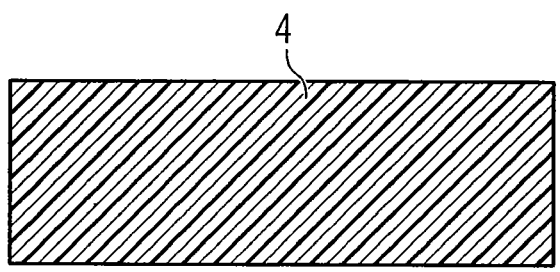
Figure 5B:
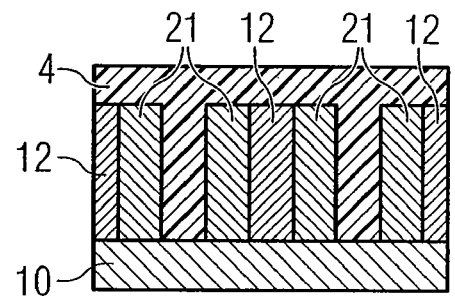

Afterward, as shown in FIGS. 5a and 5b, a layer of a filling material 4 is applied in large-area fashion on the lines 12 and the spacers 21 whilst filling the cutouts. Polysilicon or tungsten, by way of example, is taken into consideration as filling material 4.

Figure 6A:
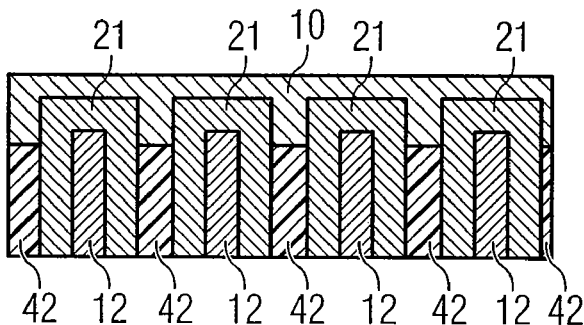
Figure 6B:
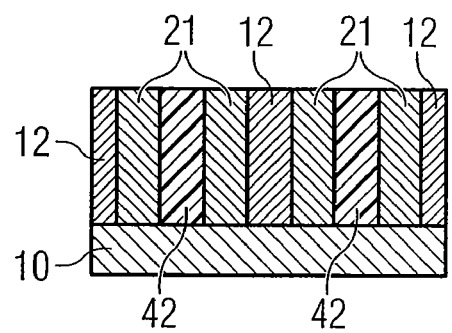

Afterward, the filling material 4 is removed or eroded in such a way that the filling material 4, as shown in FIGS. 6a and 6b, only remains within the cutouts provided between the spacers 21. This may be carried out for example in the context of a dry etching process, if appropriate with the aid of a further photoresist layer (not illustrated) serving as an etching mask. It is also possible additionally to use a CMP process (chemical mechanical polishing). The erosion or removal of the filling material 4 results in the formation of lines 42 arranged between the spacers 21 on the substrate surface 10.

Since the edges of the spacers 21 or of the underlying spacer layer 2 in the upper region of the cutouts may be formed in rounded fashion, the filling material 4 is preferably eroded together with the spacers 21 and the lines 12 as far as a depth at which sidewalls of the spacers 21 have a maximum inclination in a range of $-10°$ to $+10°$ with respect to a vertical. Consequently, the lines 42 also have sidewalls with a correspondingly small inclination.

Figure 7A:
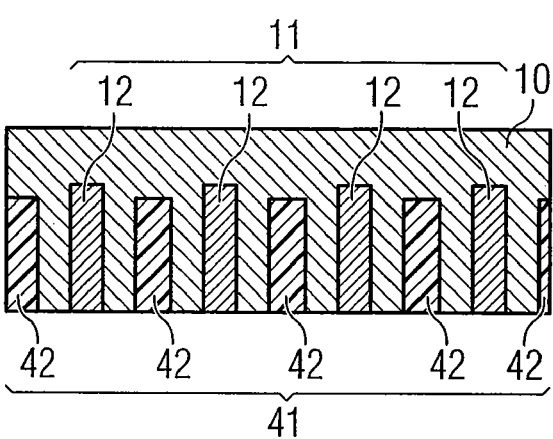
Figure 7B:
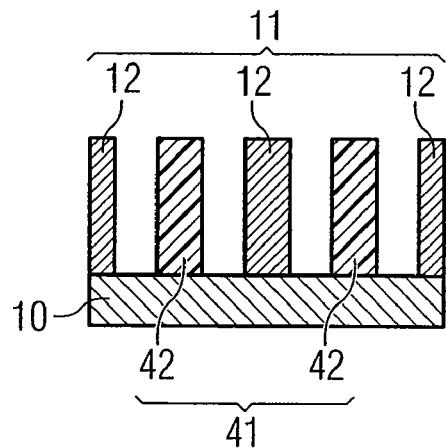

Afterward, the spacers 21 are removed for example by means of an isotropic etching method, so that a structure formed from the free-standing lines 12 of the first partial structure 11 and the free-standing lines 42 of a second partial structure 41 is arranged on the substrate surface 10, as illustrated in FIGS. 7a and 7b. In this case, the lines 42 of the second partial structure 41 are arranged in self-aligned fashion in each case essentially in the center between adjacent lines 12 of the first partial structure 11, so that lines 12, 42 of the structure produced lie on a regular distance grid. This structure may be used as an etching mask in a subsequent etching process for patterning the substrate surface 10. If the filling material 4 or the lines 42 are eroded, as described above, as far as a depth of the spacers 21 at which the sidewalls of the spacers 21 have a maximum inclination in a range of $-10°$ to $+10°$ with respect to a vertical, a particularly good etching result can be achieved with the structure serving as an etching mask.

The width of the lines 42, which preferably essentially corresponds to the width of the lines 12, is dependent on the width of the lines 12 and the width of the spacers 21 or the thickness of the underlying spacer layer 2. Correspondingly, a width fluctuation of the lines 42 is prescribed by a width fluctuation of the lines 12 and the spacers 21. If the width of the lines 12 does not correspond to a desired width after the production of the lines, the width of the lines 42 can be correspondingly corrected by an adaptation of the width of the spacers 21 or the thickness of the spacer layer 2.

In the case of the structure formed from the two partial structures 11, 41, the center-to-center distance between adjacent lines 12, 42 is half as large as the center-to-center distance between the lines 12, 42 in the individual partial structures 11, 41. If a minimum distance between the lines 12 is achieved with the aid of the lithography process used for producing the first partial structure 11, the center-to-center distance between adjacent lines 12, 42 of the entire structure consequently lies below the resolution limit of said lithography process.

The method described above may optionally be employed a number of times in order to produce a structure having lines spaced apart even closer on the substrate surface 10. For this purpose, the structure comprised of the two partial structures 11, 41 itself functions as first partial structure and the individual method for forming spacers 21 on the substrate surface 10, which adjoin sidewalls of the structure elements of the first partial structure, introducing filling material 4 into cutouts between the spacers 21 and removing the spacers 21 in order to form a second partial structure having the filling material 4 are repeated. In this case, carrying out the method twice quadruples the density of the distance grid, carrying out the method three times results in an eight-fold increase in the density of the distance grid, etc. compared with the distance grid of the original first partial structure 11 illustrated in FIGS. 2a and 2b. In the case where the method is carried out a number of times, it may be necessary for the widths of the lines of a structure produced after one cycle to be reduced by half in each case, for example with the aid of overetching.

Figure 8:
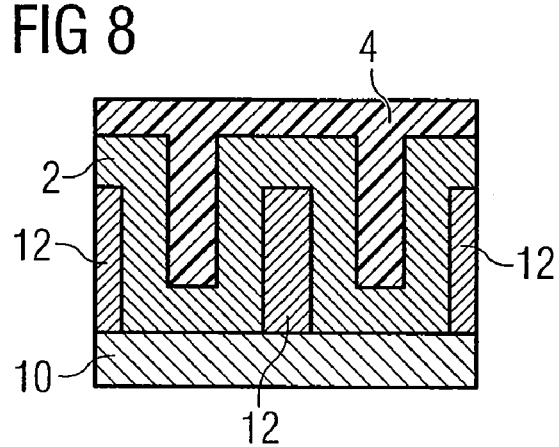
FIGS. 8 to 10 show the production of a structure on the surface of a substrate in accordance with a second embodiment of a method according to the invention in a lateral sectional illustration.

Further embodiments of a method according to the invention are conceivable for producing a structure comprised of two partial structures. In a second embodiment, after production of a first partial structure 11 comprising lines 12 that are spaced apart essentially identically on a substrate surface 10 and application of a spacer layer 2, which can be carried out in a corresponding manner in accordance with the method steps described above with reference to FIGS. 1a to 3a and 1b to 3b, an anisotropic etching of the spacer layer 2 is dispensed with. As shown in FIG. 8, firstly a filling material 4 is applied in large-area fashion to the spacer layer 2 whilst filling the cutouts provided from the spacer layer 2.

Figure 9:
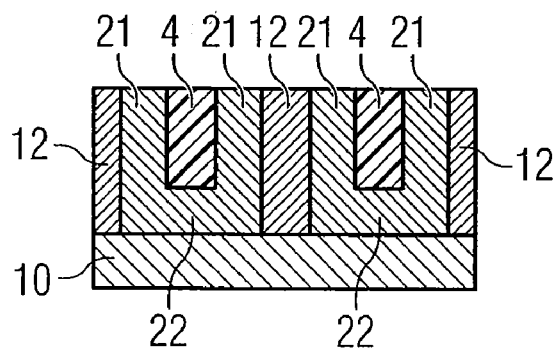

Afterward, the filling material 4 and a part of the spacer layer 2 are eroded for example with the aid of a dry etching process or a CMP method in such a way that the surfaces of the lines 12, as illustrated in FIG. 9, are uncovered and the filling material 4 remains within the cutouts provided from the spacer layer 2 or spacers 21. In this case, the spacers 21 are connected by webs 22 which in each case form the lower end of the cutouts between the spacers 21. In this case, too, it is preferred for the filling material 4, the spacer layer 2 and, if appropriate, additionally the lines 12 to be eroded in an upper region as far as a depth of the cutouts at which sidewalls of the spacers 21 have a maximum inclination in a range of $-10°$ to $+10°$ with respect to a vertical.

Figure 10:
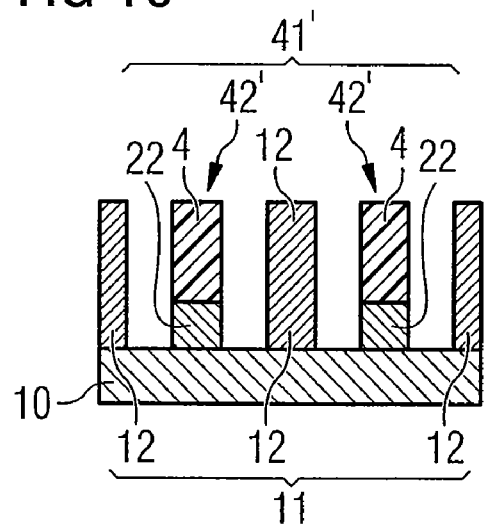

The spacers 21 are subsequently removed by means of an anisotropic etching process, thereby giving rise, as illustrated in FIG. 10, to a structure formed from the free-standing lines 12 of the first partial structure 11 and from free-standing lines 42' of a second partial structure 41' on the substrate surface 10, the lines 42' of the partial structure 41' again being arranged in self-aligned fashion essentially in the center between the lines 12 of the partial structure 11. In contrast to the second partial structure 41 illustrated in FIGS. 7a and 7b, the lines 42' of the partial structure 41' additionally comprise, besides the filling material 4, the webs 22 arranged beneath the filling material 4.

This second embodiment of a method according to the invention can also be repeated a number of times in accordance with the first embodiment described above in order to increase the density of the distance grid of the lines. With regard to the substrate surface 10, the lines 12, the spacer layer 2 and the filling material 4, it is likewise possible to use the abovementioned materials.

Figure 11:
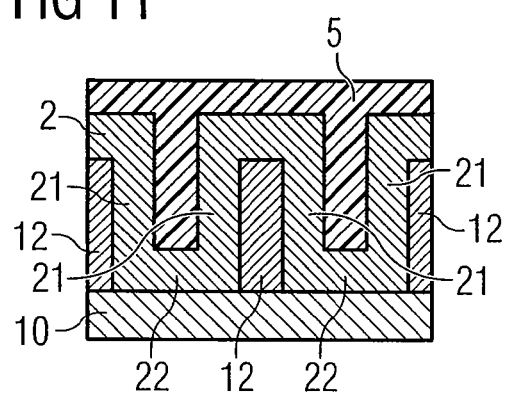
FIGS. 11 to 14 show the production of a structure on the surface of a substrate in accordance with a third embodiment of a method according to the invention in a lateral sectional illustration.

In contrast to the methods described above, a photoresist is used as filling material in a third embodiment of a method according to the invention. In the case of this embodiment, once again in accordance with the method explained with reference to FIGS. 1a to 3a and 1b to 3b, a first partial structure 11 formed from lines 12 is produced on a substrate surface 10 and a spacer layer 2 covering the lines 12 is applied in large-area fashion on the substrate surface 10 in order to form spacers 21. Afterward, as shown in FIG. 11, a photoresist layer 5 is applied in large-area fashion on the substrate surface 10 or on the spacer layer 2. In this case, the cutouts that are provided between the spacers 21 and are delimited at the lower end by webs 22 of the spacer layer 2 are filled.

Figure 12:
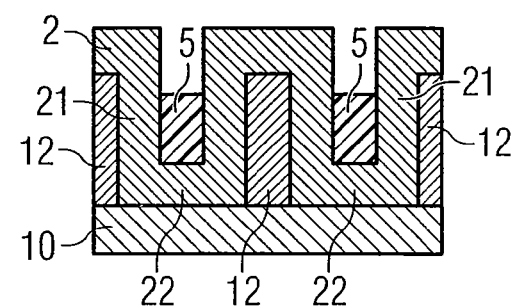

The photoresist 5 is subsequently removed outside the cutouts. For this purpose, the photoresist layer 5 is firstly exposed in large-area fashion, the photoresist 5 situated within the cutouts experiencing no exposure starting from a certain depth on account of absorption and/or detraction of the exposure radiation. In a subsequent development operation, the photoresist 5 is consequently removed outside the cutouts and in an upper region within the cutouts, while the cutouts, as illustrated in FIG. 12, remain filled with the photoresist 5 in a lower region. In this region of the cutouts, the sidewalls of the spacers 21 preferably have a maximum inclination in a range of −10° to +10° with respect to a vertical.

Figure 13:
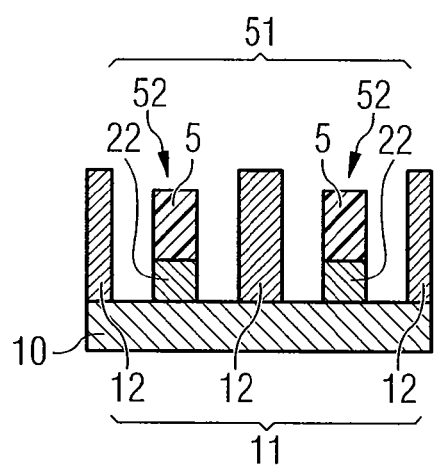

Afterward, as shown in FIG. 13, the spacer layer 2 is removed by means of an anisotropic etching in such a way that a structure formed from the free-standing lines 12 of the first partial structure 11 and from free-standing lines 52 of a second partial structure 51 remains on the substrate surface 10. The lines 52 of the second partial structure 51, which are arranged in each case essentially in the center between the lines 12 of the first partial structure 11, in this case comprise the residual webs 22 of the spacer layer 2 and the photoresist 5 arranged thereon.

Figure 14:
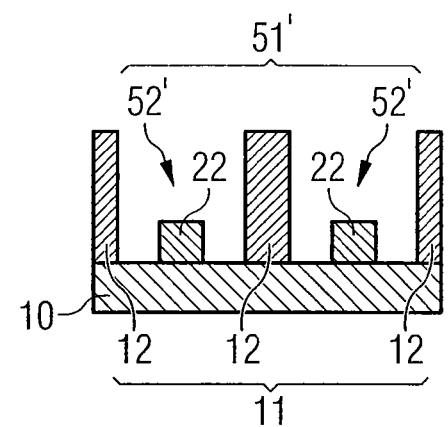

Optionally, as illustrated in FIG. 14, the residual photoresist 5 of the lines 52 may be removed by means of a subsequent exposure and development process, so that only lines 52' comprising the webs 22 form a second partial structure 51'.

In the case of this third embodiment of a method according to the invention, in accordance with the embodiments described above, there is the possibility of multiply repeating the method in order to increase the density of the distance grid of the lines. The abovementioned materials can also be used with regard to the substrate surface 10, the lines 12 and the spacer layer 2.

If appropriate, however, it is preferable to use a light-absorbing material such as, for example, silicon oxynitride for the spacer layer 2 in order to promote the sought absorption of exposure radiation within the cutouts during the large-area exposure of the photoresist layer 5. In this case, the substrate surface 10 may have a topmost layer made of silicon dioxide, for example.

Instead of forming the layer 1 used for producing the lines 12 of the first partial structure 11 from polysilicon or tungsten in the described embodiments of a method according to the invention, it is possible, as an alternative, to use silicon dioxide or silicon nitride for said layer 1. In this case, the substrate surface 10 may likewise have a silicon nitride or silicon dioxide layer. In particular when a photoresist is used as filling material, it is possible, besides the silicon oxynitride mentioned, to use other light-absorbing materials such as silicon, tungsten or aluminum, for example, for the spacer layer 2.

If a photoresist layer is used as filling material, the photoresist layer may optionally also be exposed and developed in patterned fashion in order to remove the photoresist layer outside the cutouts provided between spacers. A patterned exposure and development of a photoresist layer used as filling material may furthermore be used very advantageously for producing additional structure elements on a substrate surface which, by way of example, connect the structure elements of the partial structures produced to one another. In particular, a patterned photoresist layer itself can be used as an etching mask for producing further structure elements.

Figure 15:
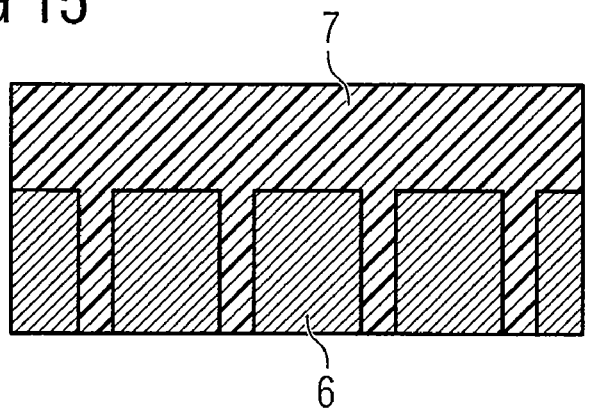
FIGS. 15 to 20 show the production of a structure on the surface of a substrate in accordance with a fourth embodiment of a method according to the invention in plan view.
Figure 16:
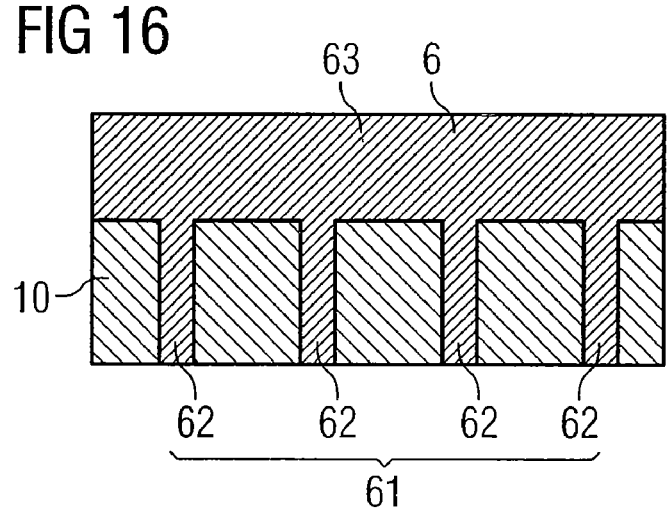
Figure 17:
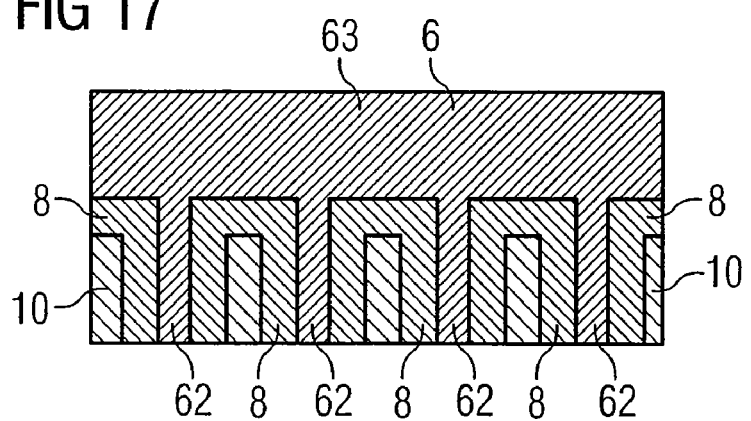

For this purpose, FIGS. 15 to 20 illustrate the production of a structure on the surface of a substrate 10 in accordance with a fourth embodiment of a method according to the invention in plan view. As shown in FIGS. 15 and 16, in the context of a customary lithography process, a first partial structure 61 is formed on the substrate surface 10, which, besides lines 62 that are arranged regularly and spaced apart essentially identically, additionally has a large-area structure element 63 adjoining the lines 62. The center-to-center distance between adjacent lines 62 is preferably minimal.

In order to produce the partial structure 61, a layer 6 made of polysilicon or tungsten, for example, is applied to the substrate surface 10 and patterned by means of a patterned photoresist layer 7 formed on the layer 6 in an etching process. The photoresist layer 7 is subsequently removed again.

Afterward, a spacer layer is deposited in large-area fashion onto the substrate surface 10 and the first partial structure 61. The spacer layer is then subjected to an isotropic etching process in order, as revealed in FIG. 17, to form spacers 8 adjoining the sidewalls of the lines 62 and of the large-area structure element 63 on the substrate surface 10. Cutouts uncovering the substrate surface 10 are provided between the spacers 8.

Figure 18:
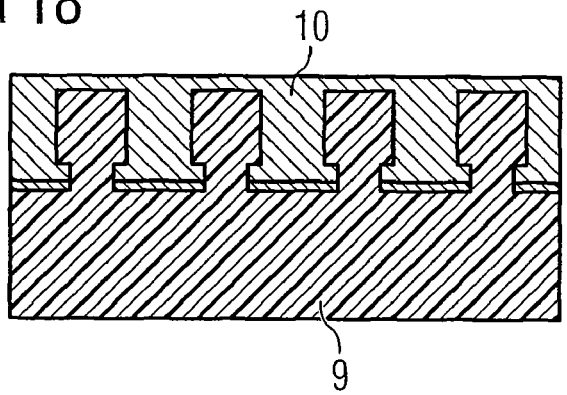
Figure 19:
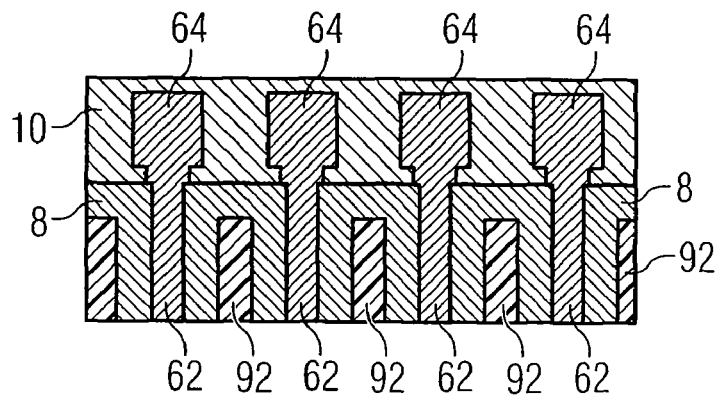

Afterward, a photoresist layer 9 serving as filling material is applied in large-area fashion on the substrate surface 10 or on the structure element 63, the lines 62 and the spacers 8. The photoresist layer 9 is subsequently exposed and developed in patterned fashion and, in a subsequent etching process, as illustrated in FIG. 18, used as an etching mask for patterning the large-area structure element 63. As shown in FIG. 19, structure elements adjoining the lines 62 in the form of widened areas 64 are produced in this case from the large-area structure elements 63.

In the course of this etching process, the patterned photoresist layer 9 may be removed in such a way that the photoresist, as represented in FIG. 19, remains within the cutouts provided between the spacers 8 and forms lines 92 there. The lines 92 here are arranged in each case essentially in the center between adjacent lines 62. As an alternative, there is the possibility of carrying out a further etching process and, if appropriate, additionally a CMP process in order to remove the photoresist layer 9 after the patterning of the large-area structure element 63.

Figure 20:
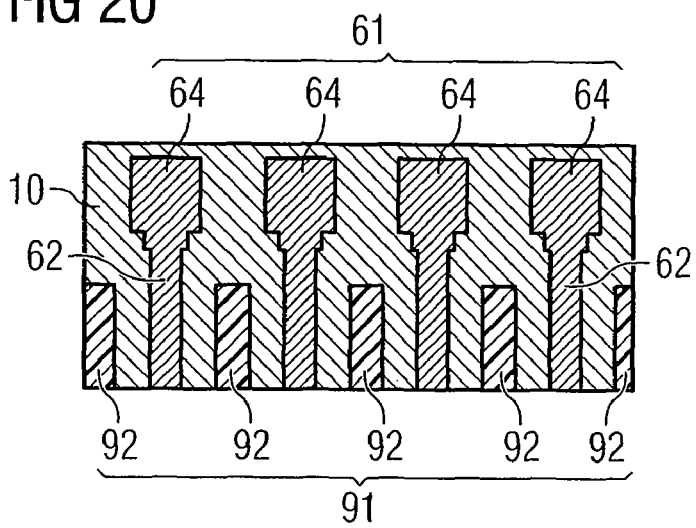

Afterward, the spacers 8 are removed with the aid of an isotropic etching process, so that there arises on the substrate surface 10, as illustrated in FIG. 20, a structure composed of the first partial structure 61 comprising the free-standing lines 62 and the widened areas 64 and a second partial structure 91 comprising the free-standing lines 92. This structure may again be used as an etching mask for patterning the substrate surface 10 or a layer of the substrate surface 10.

The above-described embodiments of a method according to the invention for producing a structure serving as an etching mask on the surface of a substrate represent particularly preferred embodiments. Alternative embodiments which represent further modifications or combinations of the methods described are furthermore conceivable.

By way of example, it is possible, in the case of the above-described fourth embodiment of a method according to the invention, instead of an isotropic etching of the spacer layer applied in large-area fashion, to erode the spacer layer by means of a CMP process, for example, in order to uncover the surfaces of the structure elements of the first partial structure. In this case, the spacers are consequently connected to webs which form the lower end of the cutouts provided between the spacers and are therefore a constituent of the lines of the second partial structure after the method has been carried out.

Furthermore, there is the possibility, in the case of the methods described, to produce a first partial structure with structure elements which have a geometry that deviates from a line. The consequence of this is that the structure elements of the second partial structure also have a geometry that deviates from a line.

Moreover, in the case of the described embodiments of a method according to the invention for producing the first partial structure, it is possible to use phase masks in order to obtain a minimum distance between the structure elements. The use of deep, UV, X-ray, electron or ion lithography is also possible for this purpose.

| List of Reference Symbols | |
|---|---|
| 1 | Layer |
| 10 | Substrate (surface) |
| 11 | First partial structure |
| 12 | Line |
| 2 | Spacer layer |
| 21 | Spacer |
| 22 | Web |
| 3 | (patterned) photoresist layer |
| 4 | Layer/filling material |
| 41, 41' | Second partial structure |
| 42, 42' | Line |
| 5 | Photoresist (layer) |
| 51, 51' | Second partial structure |
| 52, 52' | Line |
| 6 | Layer |
| 61 | First partial structure |
| 62 | Line |
| 63 | Large-area structure element |
| 64 | Widened area |
| 7 | (patterned) photoresist layer |
| 8 | Spacer |
| 9 | (patterned) photoresist layer |
| 91 | Second partial structure |
| 92 | Line |

What is claimed is:

1. A method of manufacturing an integrated circuit on a surface of a substrate comprising:

forming a first partial structure on the surface of the substrate, the first partial structure comprising two first line elements running in parallel to each other;

applying a spacer layer on the substrate and the first partial structure, thereby providing a cutout between the two first line elements;

introducing filling material into the cutout in a way as to expose a surface of the spacer layer, thereby forming a second line element as part of a second partial structure;

removing the spacer layer arranged between the second line element and the two first line elements;

applying a further spacer layer on the substrate, thereby providing further cutouts between the second line element and each one of the two first line elements;

introducing further filling material into the further cutouts in a way as to expose a surface of the further spacer layer, thereby forming third line elements as part of a third partial structure between the second line element and each one of the two first line elements; and removing the further spacer layer arranged between neighboring line elements of the first, second and third partial structure.

2. The method according to claim 1, further comprising patterning the substrate in a subsequent etching step using the first partial structure, the second partial structure and the third partial structure as an etch mask.

3. The method according to claim 1, further comprising chemical mechanical polishing after introducing the filling material, thereby uncovering the two first line elements while leaving the filling material in the cutout.

4. The method according to claim 1, wherein introducing the filling material comprises applying the filling material in a large-area fashion and removing a portion of the filling material to expose a surface of the spacer layer.

5. The method according to claim 1, wherein the filling material comprises photoresist.

6. The method according to claim 1, further comprising, before introducing the filling material, exposing the two first line elements of the first partial structure and the substrate in the cutout by anisotropically etching.

7. The method according to claim 1, wherein forming the first partial structure comprises applying a first layer on the substrate surface, depositing, exposing and developing a photoresist layer on the first layer to form a mask, and patterning the first layer using the mask, and wherein one of the group of overexposing and overdeveloping the photoresist layer is employed.

8. The method according to claim 1, wherein forming the first partial structure comprises applying a first layer on the substrate surface, depositing, exposing and developing a photoresist layer on the first layer to form a mask, and patterning the first layer using the mask, wherein patterning the first layer comprises laterally overetching the first partial structure.

9. The method according to claim 1, wherein removing the spacer layer comprises an anisotropical etching step.

10. The method according to claim 1, wherein the cutout has a width substantially equal to the width of at least one of the two first line elements.

11. The method according to claim 1, wherein the spacer layer comprises one of the group of silicon oxide and silicon nitride.

12. The method according to claim 1, further comprising before applying the further spacer layer:

reducing the width of the first and second line elements.

13. A method of manufacturing an integrated circuit on a surface of a substrate, the method comprising:

forming a first partial structure on the surface of the substrate with first line elements of a first width running in parallel to each other;

forming spacers on the surface of the substrate, each spacer comprising sidewall spacers and a web spacer, the sidewall spacers adjoining sidewalls of the first line elements of the first partial structure such that cutouts are provided, the cutouts having a second width and being located in the center between two neighboring first line elements, and the web spacer connecting the sidewall spacers;

introducing filling material into the cutouts, a surface of the spacers being uncovered;

removing the sidewall spacers by anisotropical etching to form a second partial structure with second line elements being formed of the filling material and the remaining portion of the web spacer; and patterning the substrate using the first and second partial structure as a mask.

14. The method according to claim 13, wherein the first and second width are substantially equal.

15. The method according to claim 13, wherein the width of each sidewall spacer is substantially equal to the first width.

16. The method according to claim 13, wherein introducing filling material into the cutouts comprises applying filling material in a large-area fashion and subsequently removing a portion of the filling material to expose a surface of the sidewall spacers.

17. The method according to claim 13, wherein the filling material comprises photoresist.

18. The method according to claim 17, wherein the photoresist is exposed and developed in such a way that portions of the photoresist remain in the cutouts.

19. The method according to claim 13, wherein the steps of forming spacers, introducing filling material and removing sidewall spacers are repeated before patterning the substrate, the partial structures produced in a cycle functioning as first partial structure in the subsequent cycle.

20. The method according to claim 13, wherein forming the first partial structure comprises applying a first layer on the substrate surface, depositing, exposing and developing a photoresist layer on the first layer to form a mask, and patterning the first layer using the mask, and wherein one of the group of overexposing and overdeveloping the photoresist layer is employed.

21. The method according to claim 13, wherein forming the first partial structure comprises applying a first layer on the substrate surface, depositing, exposing and developing a photoresist layer on the first layer to form a mask, and patterning the first layer using the mask, wherein patterning the first layer comprises laterally overetching the first partial structure.

22. A method of manufacturing an integrated circuit on a surface of a substrate comprising:

forming a first partial structure on the surface of the substrate, the first partial structure comprising two first line elements running in parallel to each other;

applying a spacer layer on the substrate and the first partial structure, thereby providing a cutout between the two first line elements;

partially removing the spacer layer, wherein surfaces of the two first line elements and a surface of the substrate in the cutout between the two first line elements are exposed, and wherein the remaining spacer layer adjoins sidewalls of the two first line elements;

after partially removing the spacer layer, introducing filling material into the cutout in a way as to expose a surface of the spacer layer, thereby forming a second line element as part of a second partial structure;

removing the spacer layer arranged between the second line element and the two first line elements; and patterning the substrate in a subsequent etching step using the first partial structure and the second partial structure as an etch mask.

\* \* \* \* \*